(12) United States Patent
Kinsman et al.

(10) Patent No.: US 11,508,776 B2
(45) Date of Patent: *Nov. 22, 2022

(54) IMAGE SENSOR SEMICONDUCTOR PACKAGES AND RELATED METHODS

(71) Applicant: SEMICONDUCTOR COMPONENTS INDUSTRIES, LLC, Phoenix, AZ (US)

(72) Inventors: Larry Kinsman, Boise, ID (US); Yusheng Lin, Phoenix, AZ (US); Yu-Te Hsieh, Taoyuan (TW); Oswald Skeete, San Jose, CA (US); Weng-Jin Wu, Hsinchu (TW); Chi-Yao Kuo, Taipei (TW)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 426 days.

This patent is subject to a terminal disclaimer.

(21) Appl. No.: 16/374,720

(22) Filed: Apr. 3, 2019

(65) Prior Publication Data

US 2019/0229144 A1  Jul. 25, 2019

Related U.S. Application Data

(63) Continuation of application No. 15/168,828, filed on May 31, 2016, now Pat. No. 10,290,672.

(51) Int. Cl.
*H01L 27/146* (2006.01)
*H01L 21/48* (2006.01)
(Continued)

(52) U.S. Cl.
CPC .... *H01L 27/14643* (2013.01); *H01L 21/4853* (2013.01); *H01L 21/565* (2013.01);
(Continued)

(58) Field of Classification Search
CPC ......... H01L 27/14643; H01L 27/14618; H01L 27/14634; H01L 27/1469; H01L 21/4853;
(Continued)

(56) References Cited

U.S. PATENT DOCUMENTS 8,711,280 B2 * 4/2014 Hagiwara ............ H04N 5/2253
348/374
9,252,172 B2   2/2016 Chow et al.
(Continued)

FOREIGN PATENT DOCUMENTS

CN       103681702 A       3/2014

OTHER PUBLICATIONS

Interposer n. : Oxford English Dictionary, Oxford English Dictionary, https://www.oed.com/view/Entry/98194?redirectedFrom=interposer#eid.*

(Continued)

*Primary Examiner* — Daniel Whalen
(74) *Attorney, Agent, or Firm* — Adam R. Stephenson, Ltd.

(57) ABSTRACT

An image sensor semiconductor package (package) includes a printed circuit board (PCB) having a first surface and a second surface opposite the first surface. A complementary metal-oxide semiconductor (CMOS) image sensor (CIS) die has a first surface with a photosensitive region and a second surface opposite the first surface of the CIS die. The second surface of the CIS die is coupled with the first surface of the PCB. A transparent cover is coupled over the photosensitive region of the CIS die. An image signal processor (ISP) is embedded within the PCB. One or more electrical couplers electrically couple the CIS die with the PCB. A plurality of electrical contacts on the second surface of the PCB are electrically coupled with the CIS die and with the ISP. The
(Continued)

ISP is located between the plurality of electrical contacts of the second surface of the PCB and the CIS die.

20 Claims, 4 Drawing Sheets

(51) Int. Cl.
  *H01L 21/56* (2006.01)
  *H01L 23/498* (2006.01)
  *H04N 5/374* (2011.01)
(52) U.S. Cl.
  CPC .. *H01L 23/49816* (2013.01); *H01L 23/49838* (2013.01); *H01L 27/1469* (2013.01); *H01L 27/14618* (2013.01); *H01L 27/14634* (2013.01); *H01L 27/14636* (2013.01); *H04N 5/374* (2013.01); *H01L 2224/24* (2013.01); *H01L 2224/48091* (2013.01); *H01L 2224/48227* (2013.01); *H01L 2924/16195* (2013.01); *H01L 2924/16235* (2013.01); *H01L 2924/181* (2013.01)
(58) Field of Classification Search
  CPC ............. H01L 21/565; H01L 23/49816; H01L 23/49838
  See application file for complete search history.

(56) References Cited

U.S. PATENT DOCUMENTS

| | | | |
|---|---|---|---|
| 9,263,492 | B2 | 2/2016 | Hwang |
| 10,290,672 | B2* | 5/2019 | Kinsman ............. H01L 21/4853 |
| 2002/0096753 | A1 | 7/2002 | Tu et al. |
| 2003/0164540 | A1 | 9/2003 | Lee et al. |
| 2005/0174469 | A1 | 8/2005 | Cho et al. |
| 2008/0157250 | A1 | 7/2008 | Yang et al. |
| 2008/0173792 | A1 | 7/2008 | Yang et al. |
| 2010/0072618 | A1 | 3/2010 | Camacho et al. |
| 2010/0200898 | A1 | 8/2010 | Lin et al. |
| 2011/0141318 | A1 | 6/2011 | Lee et al. |
| 2014/0070348 | A1 | 3/2014 | Yee et al. |
| 2014/0183676 | A1 | 7/2014 | Liu |
| 2014/0270057 | A1 | 9/2014 | Bartolome et al. |
| 2014/0285671 | A1* | 9/2014 | Ishii .................. H01L 27/14625 348/164 |

OTHER PUBLICATIONS

Global Semiconductor Alliance, "Embedded Die Packaging Technologies Enable Innovative 2D and 3D Structures for Portable Applications," Forum, Mar. 1, 2014, pp. 1-20, vol. 21, No. 1, Publisher: Global Semiconductor Alliance.

International Search Report/Written Opinion, PCT Patent Application No. PCT/US2017/028534, dated Oct. 9, 2017, 25 pages.

* cited by examiner

IMAGE SENSOR SEMICONDUCTOR PACKAGES AND RELATED METHODS

CROSS REFERENCE TO RELATED APPLICATIONS

This application is a continuation application of the earlier U.S. Utility Patent Application to Kinsman et al. entitled "Image Sensor Semiconductor Packages and Related Methods," application Ser. No. 15/168,828, filed May 31, 2016, now pending, the disclosure of which is hereby incorporated entirely herein by reference.

BACKGROUND

1. Technical Field

Aspects of this document relate generally to semiconductor packages. More specific implementations involve image sensor semiconductor packages.

2. Background

Image sensors convey information related to an image by communicating signals in response to incident electromagnetic radiation. Image sensors are used in a variety of devices including smart phones, digital cameras, night vision devices, medical imagers, and many others. Semiconductor imagers utilizing charge-coupled device (CCD) and complementary metal-oxide semiconductor (CMOS) architectures are currently in use.

SUMMARY

Implementations of image sensor semiconductor packages (packages) may include: a printed circuit board (PCB) having a first surface and a second surface opposite the first surface; a complementary metal-oxide semiconductor (CMOS) image sensor (CIS) die having a first surface with a photosensitive region and a second surface opposite the first surface of the CIS die, the second surface of the CIS die coupled with the first surface of the PCB; a transparent cover coupled over the photosensitive region of the CIS die; an image signal processor (ISP) embedded within the PCB; one or more electrical couplers electrically coupling the CIS die with the PCB, and; a plurality of electrical contacts formed at the second surface of the PCB and electrically coupled with the CIS die and with the ISP; wherein the ISP is located between the plurality of electrical contacts of the second surface of the PCB and the CIS die.

Implementations of image sensor semiconductor packages (packages) may include one, all, or any of the following:

The one or more electrical couplers coupling the CIS die with the PCB may include wirebonds coupling electrical contacts on the first surface of the CIS die with the first surface of the PCB.

The one or more electrical couplers coupling the CIS die with the PCB may include electrical couplers coupling electrical contacts on the second surface of the CIS die with the first surface of the PCB.

One or more redistribution layers (RDLs) may fan out one or more electrical contacts of the ISP by electrically coupling the one or more electrical contacts of the ISP with one or more of the plurality of electrical contacts formed at the second surface of the PCB.

The ISP may be located between the first surface of the PCB and the second surface of the PCB.

The transparent cover may not directly contact the CIS die.

The package may be a ball grid array (BGA) package.

Implementations of image sensor semiconductor packages (packages) may include: a printed circuit board (PCB) having a first surface and a second surface opposite the first surface; an interposer having a first surface and a second surface opposite the first surface of the interposer, the interposer having a recess in its second surface and including one or more electrical vias passing through the interposer from the first surface of the interposer to the second surface of the interposer; a complementary metal-oxide semiconductor (CMOS) image sensor (CIS) die having a first surface with a photosensitive region and a second surface opposite the first surface of the CIS die, the second surface of the CIS die coupled with the first surface of the interposer; an image signal processor (ISP) coupled within the recess of the interposer; one or more electrical couplers electrically coupling the CIS die with the PCB through the one or more electrical vias of the interposer, and; a plurality of electrical contacts formed at the second surface of the PCB and electrically coupled with the CIS die and with the ISP.

Implementations of image sensor semiconductor packages (packages) may include one, all, or any of the following:

The plurality of electrical contacts formed at the second surface of the PCB may include solder bumps.

One or more redistribution layers (RDLs) may fan out one or more electrical contacts of the ISP by electrically coupling the one or more electrical contacts of the ISP with one or more of the plurality of electrical contacts formed at the second surface of the PCB.

The package may not have an image signal processor at the second surface of the PCB.

Implementations of methods of forming an image sensor semiconductor package (package) may include: providing a printed circuit board (PCB) having a first surface and a second surface opposite the first surface, the PCB having an image signal processor (ISP) included therein; coupling a complementary metal-oxide semiconductor (CMOS) image sensor (CIS) die with the PCB, wherein the CIS die has a first surface with a photosensitive region and a second surface opposite the first surface of the CIS die, wherein the second surface of the CIS die is coupled with the first surface of the PCB; coupling a transparent cover over the photosensitive region of the CIS die; electrically coupling the CIS die with the PCB using one or more electrical couplers, and; forming a plurality of electrical contacts at the second surface of the PCB that are electrically coupled with the CIS die and with the ISP; wherein the ISP is located between the plurality of electrical contacts at the second surface of the PCB and the CIS die.

Implementations of methods of forming an image sensor semiconductor package (package) may include one, all, or any of the following:

Electrically coupling electrical contacts on the second surface of the CIS die with the first surface of the PCB.

At least partially encapsulating the one or more electrical couplers with an encapsulant.

Coupling a plurality of electrical contacts of the ISP with a redistribution layer (RDL) that couples the plurality of electrical contacts of the ISP with one or more of the plurality of electrical contacts formed at the second surface of the PCB.

Forming the plurality of electrical contacts at the second surface of the PCB may include forming solder bumps.

The ISP may be located between the first surface of the PCB and the second surface of the PCB.

Implementations of methods of forming an image sensor semiconductor package (package) may include: providing an interposer having a first surface and a second surface opposite the first surface of the interposer, the second surface of the interposer having a recess therein; forming one or more electrical vias through the interposer from the first surface of the interposer to the second surface of the interposer; coupling an image signal processor (ISP) within the recess of the interposer and electrically coupling the ISP with the one or more electrical vias; coupling the interposer with a first surface of a printed circuit board (PCB), the PCB also having a second surface opposite the first surface of the PCB; coupling a complementary metal-oxide semiconductor (CMOS) image sensor (CIS) die with the interposer, the CIS die having a first surface with a photosensitive region and a second surface opposite the first surface of the CIS die, the second surface of the CIS die coupled with the first surface of the interposer; electrically coupling the CIS die with one or more electrical contacts located at the second surface of the PCB through the one or more electrical vias of the interposer, and; electrically coupling the ISP with the CIS die through the one or more electrical vias of the interposer.

Implementations of methods of forming an image sensor semiconductor package (package) may include one, all, or any of the following:

At least partially encapsulating the CIS die in an encapsulant.

Forming one or more redistribution layers (RDLs) electrically coupling one or more electrical contacts of the ISP with one or more of the plurality of electrical contacts formed at the second surface of the PCB.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended image sensor semiconductor packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such image sensor semiconductor packages and related methods, and implementing components and methods, consistent with the intended operation and methods.

Figure 1:
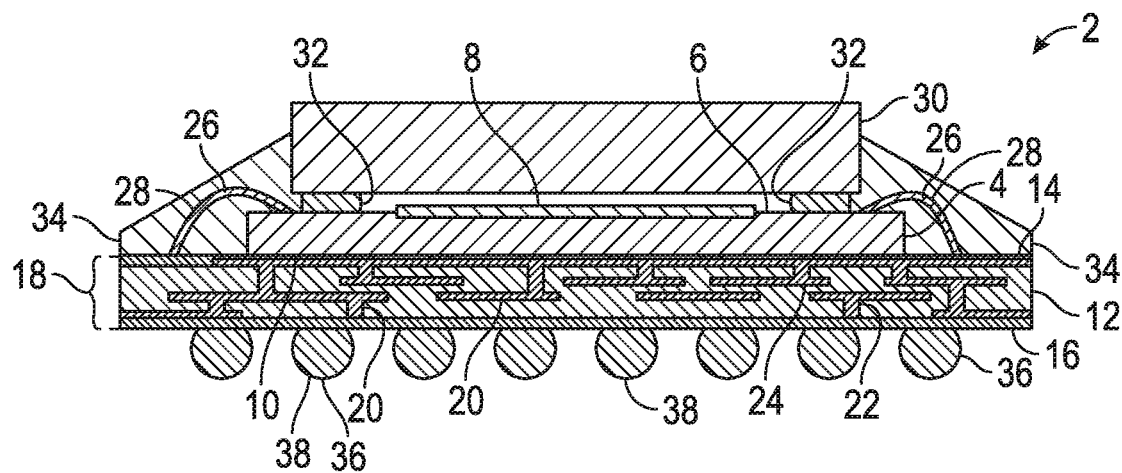
FIG. 1 is a cross-section view of a complementary metal-oxide semiconductor (CMOS) image sensor (CIS) semiconductor package (CIS package)

Referring now to FIG. 1, a complementary metal-oxide semiconductor (CMOS) image sensor (CIS) semiconductor package (CIS package) (package) 2 is shown. The CIS package includes a CMOS image sensor (CIS) die (die) 4 having a first surface 6 (the top surface shown in FIG. 1) with a photosensitive region 8 thereon. The CIS die also has a second surface 10 on an opposite side of the CIS die from its first surface. The CIS die may have electrical contacts on either or both of the first surface and/or the second surface, such as electrical contact pads and the like, for making various electrical connections to/from the CIS die with other package components and/or electrical devices external to the package. These electrical contacts are not shown in FIG. 1 but may be flush with the first and/or second surfaces of the CIS die and/or may be slightly raised or recessed therefrom.

In the implementation shown the second surface of the CIS die is coupled with a first surface 14 of a printed circuit board (PCB) (motherboard) 12. The PCB has a second surface 16 on an opposite side of the PCB from its first surface and is formed of a plurality of layers 18. The layers may include laminate layers, polymer layers, metallic elements and/or layers, electrically conductive elements and/or layers, metallic vias, metallic traces, solder resist layers or portions, epoxy layers, resin layers, and so forth. Within the layers a number of interconnects 20 are included, which may be formed of a metal (such as copper, aluminum, gold, etc.) or of other electrically conductive elements. The interconnects include a number of vertical vias 22 and horizontal traces 24 which may be formed in a variety of ways such as by laying down various laminate layers, forming vias therein and filling the vias with conductive material, forming metallic traces through plating and etching patterns therein to remove material, and so forth.

Although the electrical contacts of the first surface and/or second surface of the CIS die are not shown, they may be electrically coupled with the interconnects of the PCB through one or more electrical couplers 26. In FIG. 1 the CIS die has electrical contacts on its first surface and the electrical couplers 26 are wirebonds 28 coupling the electrical contacts of the firsts surface of the CIS die with the first surface of the PCB. The wirebonds in the representative example are gold wires though other metals or conductive elements could be used. In other implementations the CIS die could have electrical contacts on its second surface and electrical coupling between the CIS die and PCB may be achieved through contact of the second surface of the CIS die with the first surface of the PCB with or without the additional use of wirebonds 28.

The interconnects of the PCB couple the one or more electrical contacts of the CIS die with electrical contacts 36 formed at the second surface of the PCB. In FIG. 1 the electrical contacts at the second surface of the PCB are solder bumps 38, though in other implementations they could be metallic pads or some other element. A transparent cover 30 is located over the photosensitive region and is coupled with the CIS die using a coupler 32, which could be a solder, an adhesive, or the like. A portion of the CIS die and of the coupler and transparent cover are shown in FIG. 1 to be encapsulated with an encapsulant 34, which may be a mold compound. The encapsulant also encapsulates and protects the wirebonds. The assembly thus forms a CIS package in which the CIS die and other package elements are protected by being encased, at least partially, within the encapsulant and transparent cover.

The CIS die of the package 2 may communicate with other elements internal and/or external to the package using the electrical contacts 36. Thus the package may be included in a computer, in a smart phone, in any other electric device, and so forth, to provide an image sensing or capture function.

In various implementations, an image signal processor will be needed to process data communicated from the CIS die and/or to translate it into data useful for other applications and/or devices. The package shown in FIG. 1 does not show an ISP but the package may be coupled on a main motherboard/PCB or other element and, through the electrical contacts 36, data from the CIS die may be communicated to an ISP that is also coupled with the main motherboard/PCB for data processing. The CIS die and ISP may be coupled with long trace interconnects. The need to have a separately located ISP may increase a camera module size and the long traces could, in some implementations, affect signal integrity. The ISP may perform functions such as, by non-limiting example, Bayer transformations, demosaicing, noise reduction, image sharpening, and so forth, and the CIS die may be used in a camera, a proximity or light sensor, and so forth. Package 2 is seen to have a ball grid array (BGA) configuration and is formed, as described above, using single die chip-on-board (COB) process with wirebonds and liquid encapsulant.

Figure 2:
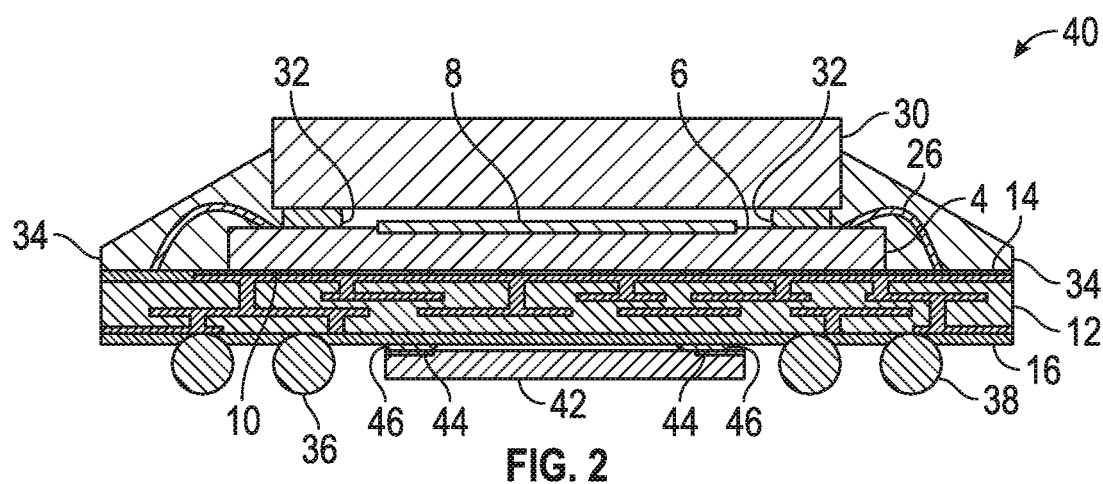
FIG. 2 is a cross-section view of another CIS package.

FIG. 2 shows an example of a CIS package (package) 40 that is similar in many ways to package 2, but which has an image signal processor (ISP) 42 coupled at an underside of the PCB 12. The ISP has a number of electrical contacts 44 (which in the implementation shown are aluminum pads, though they could be other contact types and/or formed of other metals or electrically conductive materials), and solder 46 is used to electrically and mechanically coupled the electrical contacts 44 with electrical contacts of the PCB 12. The metallic routing of the PCB 12 may be used to communicate data to/from the CIS die from/to the ISP, and the electrical contacts 36 may be used to communicate data to/from the CIS die and/or the ISP to/from some electrical element coupled with the package 40. FIG. 2 thus shows a two-die stacked package configuration in which the ISP is coupled with the PCB using a flip chip bonding process.

Figure 3:
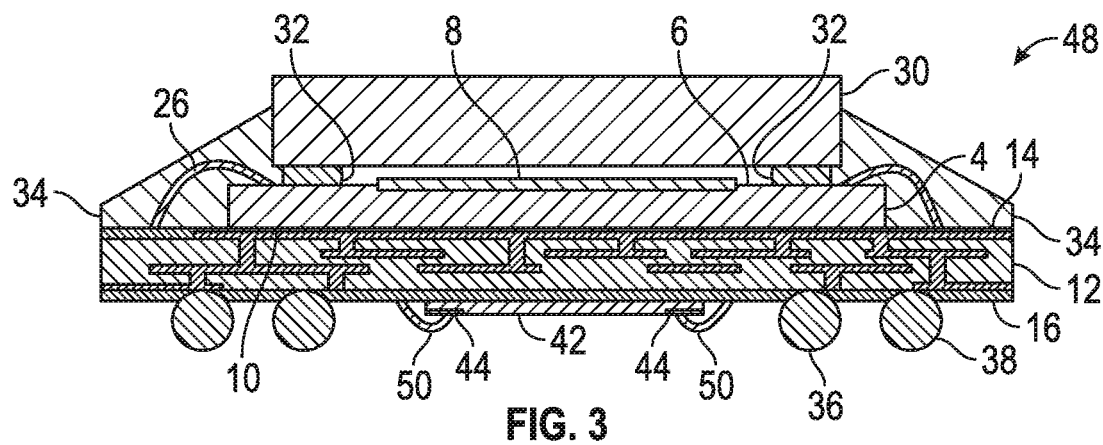
FIG. 3 is a cross-section view of another CIS package.

FIG. 3 shows an example of a CIS package (package) 48 that is identical to package 40 except the ISP is flipped so that its electrical contacts 44 face away from the PCB and wirebonds 50 are used to couple the electrical contacts 44 with electrical contacts of the PCB. FIG. 3 thus shows a two-die stacked package configuration in which the ISP is coupled with the PCB using a chip-on-board (COB) process using wirebonds.

Naturally, in the examples shown in FIGS. 2-3 there must be sufficient room at the second surface of the PCB to place the ISP, which may reduce the number of electrical contacts/solder bumps or pin count or the like of the package. This may not allow this type of structure to be used in implementations in which high speed transfer and/or a high pin (electrical contact) count is required or desirable. In the examples shown in FIGS. 2-3 the solder bump size may need to be increased so that the solder bumps make contact with a main PCB or motherboard or other device despite the ISP being present—this of course increases the overall thickness of the package. In the implementation shown in FIG. 3 the ISP may be soldered, glued, adhered, or otherwise bonded or coupled with the second surface of the PCB. In any of the implementations of FIGS. 1-3 the CIS die may likewise be soldered, glued, adhered, or otherwise bonded or coupled with the first surface of the PCB.

In the example of FIG. 2 there may be a redistribution layer (RDL) placed at the second surface of the PCB to couple the electrical contacts 44 with the appropriate traces and other elements of the PCB, while in the example of FIG. 3 an RDL may not be needed as the wirebonds may be able to couple the electrical contacts 44 with the appropriate traces and other elements of the PCB without an RDL.

Figure 4:
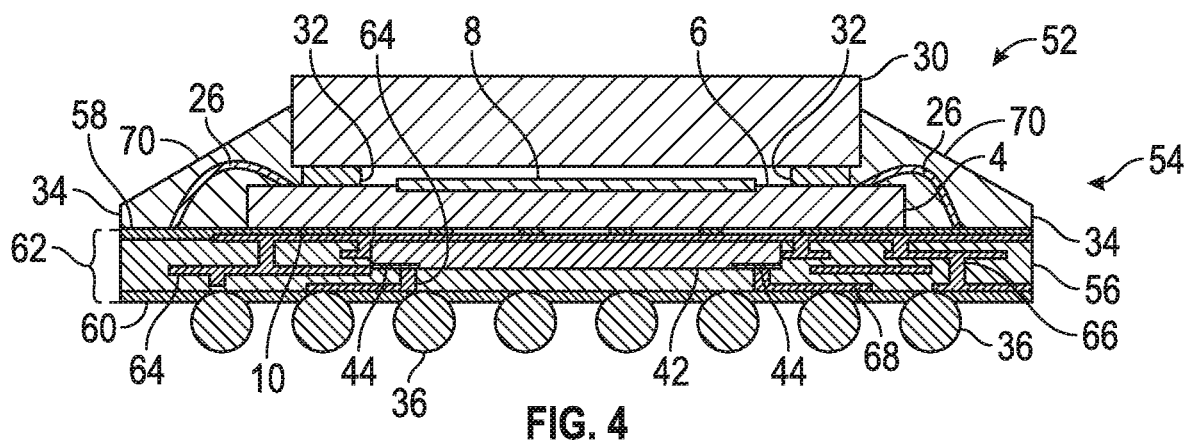
FIG. 4 is a cross-section view of an implementation of a CIS package with an embedded image signal processor (ISP)

FIG. 4 shows an implementation of a CIS package (package) 52 which includes a PCB 56 having an embedded ISP 42. The package forms a ball grid array (BGA) package 54 which in some implementations may be called an imager ball grid array (iBGA) package. The printed circuit board (PCB) 56 has a first surface 58 and a second surface 60 opposite the first surface. A number of layers 62 are included in the PCB, which may be similar to those described above for other PCBs. The PCB includes a number of interconnects 64 including vertical vias 66 and horizontal traces 68. One or more of the interconnects of the PCB may form one or more redistribution layers (RDLs) in or on the PCB and may fan out or fan in the electrical contacts 44 of the ISP. In the exemplary embodiment shown in FIG. 4 the PCB interconnects form one or more RDLs and fan out the ISP electrical contacts. The encapsulant 34 of package 52 is seen to have a sloped shape 70.

Figure 5:
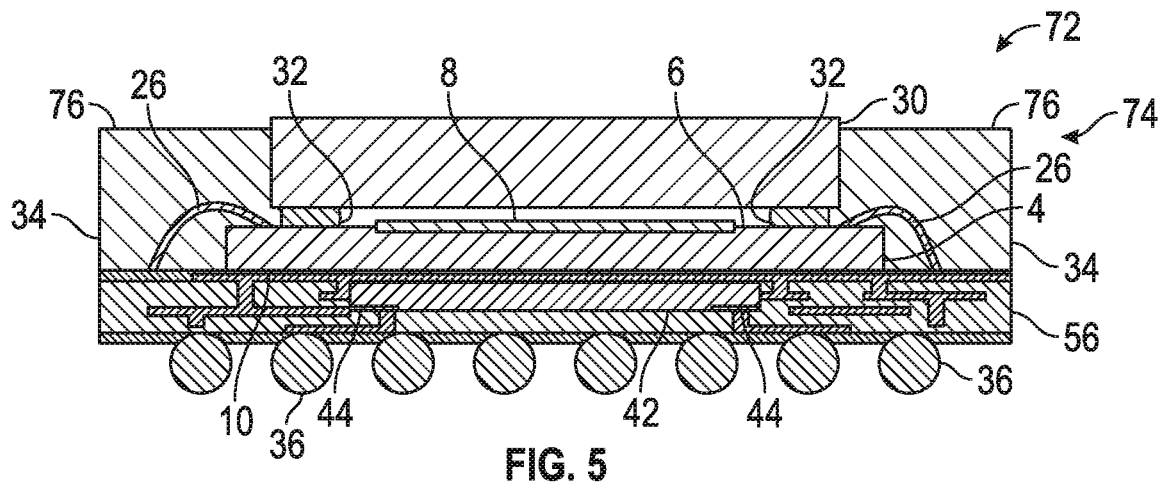
FIG. 5 is a cross-section view of another implementation of a CIS package with an embedded ISP.
Figure 6:
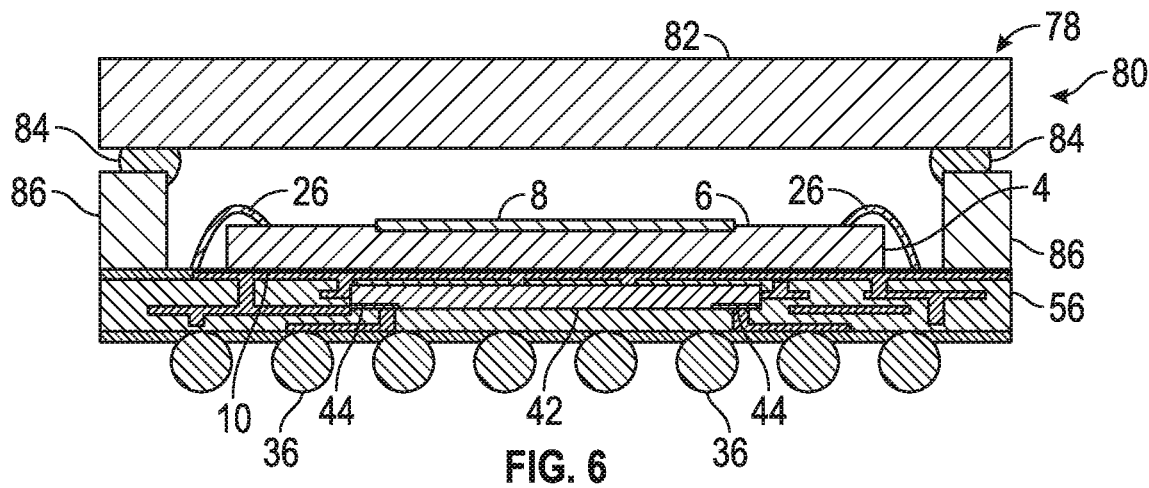
FIG. 6 is a cross-section view of another implementation of a CIS package with an embedded ISP.

FIG. 5 shows a representative example of a CIS package (package) 72 which is similar in many respects to package 52, and also forms a ball grid array (BGA) package 74, but the encapsulant is seen to have a rectangular shape 76. FIG. 6 shows a representative example of a CIS package (package) 78 which is also similar in many respects to package 52, and also forms a ball grid array (BGA) package 80, but which has a larger transparent cover 82 that is coupled using one or more couplers 84 (which may be solder, glue, an adhesive, a tape, etc.) with one or more dams 86 and excludes the encapsulant covering the wirebonds. The dams may be formed of an encapsulant, a molding polymer, a glass fiber epoxy, and so forth. In the representative example the dams are formed of an ultraviolet (UV) resin which cures upon exposure to UV light.

The representative examples shown in FIGS. 4-6 may have other configurations. As described above with respect to the examples in FIGS. 1-3, the examples of FIGS. 4-6 could exclude wirebonds between the CIS die and the PCB and instead electrical connections therebetween may be formed at the interface between the second surface of the CIS die and the first surface of the PCB (or both wirebonds and such other couplings may be present).

FIGS. 4-6 thus show CIS packages with ISP embedded substrates/PCBs. The ISP may be bonded within the PCB using either flip chip bonding, chip-on-board (COB), or build-up processes. In each example of FIGS. 4-6 there are trace connections between the ISP and CIS die in or on the PCB. The ISP may perform any of the functions described above for other ISPs and may also optimize image parameter settings for image quality, and the like. The packages of FIGS. 4-6 thus are BGA packages with ISP embedded substrates and include wirebonds electrically coupling the CIS die with the PCB, transparent covers (which in the implementations shown are glass lids) placed over the CIS die, and include liquid encapsulant for wire bond coverage (or dams as shown in FIG. 6).

Any of the package implementations of FIGS. 4-6 could be mounted in or on a chip carrier prior to being coupled with a main PCB, motherboard or other electronic device. For example, any of the packages could be included in or on a plastic leaded chip carrier (PLCC), a bump chip carrier (BCC), a ceramic leadless chip carrier (CLCC), a leadless chip carrier or a leaded chip carrier, a leaded ceramic chip carrier (LCCC), a dual lead-less chip carrier (DLCC), a package on package (PoP), or any other configuration. Alternatively, any of the packages shown in FIGS. 4-6 could be modified to itself take on the configuration of any of these chip carrier configurations.

Figure 11:
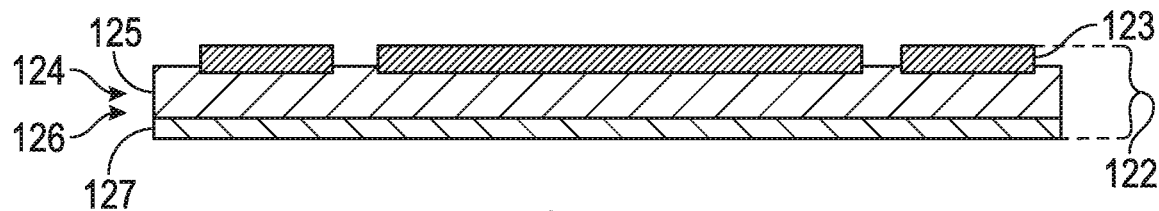
FIG. 11 is a cross-section view of elements used in the formation of the FIG. 13 printed circuit board (PCB) with embedded ISP.
Figure 12:
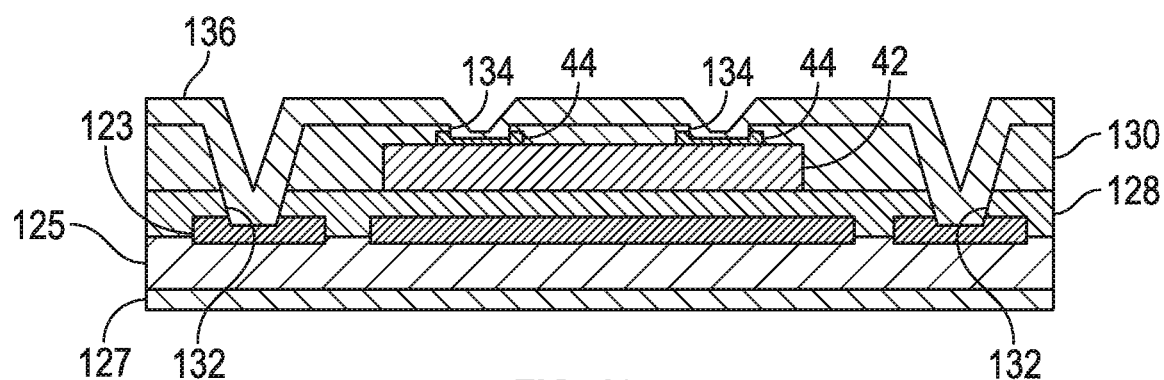
FIG. 12 is a cross-section view of the elements of FIG. 11 plus additional elements used in the formation of the FIG. 13 PCB with embedded ISP.
Figure 13:
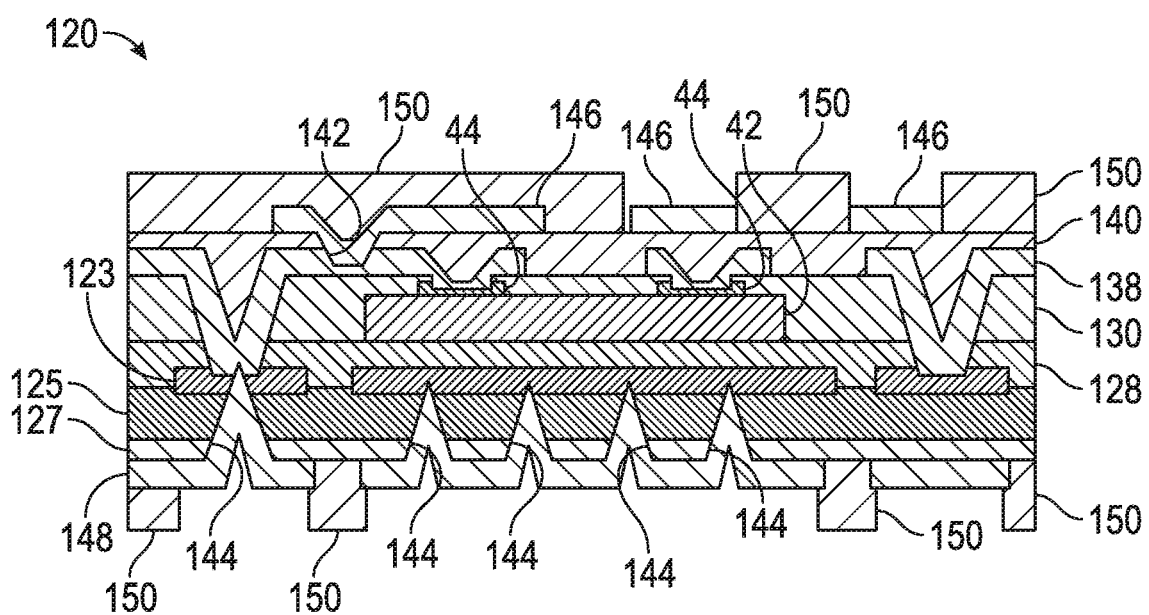
FIG. 13 is a cross-section view of a PCB with embedded ISP used in the formation of implementations of CIS packages.

Reference is now made to FIGS. 11-13 which illustrate methods used to form a representative example of an ISP embedded PCB. The completed printed circuit board (PCB) 120 is shown in FIG. 13. FIGS. 11-13 show that a substrate build-up or sequential build-up (SBU) process may be utilized and may begin with a few layers 122 (which may form core layers). The layers shown in FIG. 11 include a copper clad laminate (CCL) 124 having a first resin coated copper (RCC) layer 126. The CCL includes a copper layer 123, a first insulator layer 125 (which may be a resin, laminate, polyimide, prepreg, and/or epoxy layer), and a second insulator layer 127 (which may be a resin, laminate, polyimide, prepreg, and/or epoxy layer). It may be seen from FIG. 11 that the CCL has already been patterned and etched and/or portions of the copper layer have been selectively removed to form a pattern thereon. In implementations other types of layers could be used, including other metallic or conductive layers (such as aluminum) and/or other types of insulative layers. The first insulative layer and second insulative layer are formed of electrically insulating materials.

A number of processing steps occur between the configuration shown in FIG. 11 and the configuration shown in FIG. 12. A first laminate layer 128 is applied and the ISP 42 is placed thereon, and may be coupled therewith such as with an adhesive or solder or the like, though it may simply be placed there until it is later covered with a second laminate layer 130 which may hold it in place. The first and second laminate layers may be formed of different materials, though in implementations they could also be formed of the same laminate materials. The first and second laminate layers are formed of electrically insulative materials.

The ISP 42 is seen to be placed in a way so that the electrical contacts 44 face upwards, and electrically conductive routing or traces (interconnects and/or RDLs) of the PCB will be formed to electrically couple with the electrical contacts 44 through the substrate sequential build-up process. In in other implementations the ISP could be solder bumped and flipped to be placed on a layer of the PCB using a flip chip configuration, and other interconnects and/or RDLs could be used to electrically couple and route the electrical contacts 44 to/with other electrical elements/contacts as desired.

After the first and second laminate layers have been placed, one or more vias 132 may be formed. The vias 132 pass through the second laminate layer, the first laminate layer, and into portions of the CCL 124 (and/or the vias may expose portions of the CCL 124 without passing into them). Vias 134 are also formed which pass through the second laminate layer and into portions of the electrical contacts 44 (and/or the vias may expose portions of the electrical contacts 44 without passing into them). The vias 132 and 134 may be formed such as, by non-limiting example, using a laser drilling process, an etching process, and so forth, and may include the use of a masking or protective layer to protect those areas not desired to be etched/drilled (which masking or protective layer will then need to be removed later).

After the vias 132 and 134 are formed a conductive plating layer (layer) 136 may be applied. In the representative example this is copper plating, though in other implementations other metals or electrically conductive elements could be used. The conductive plating layer may be applied using an electro-plating or an electro-less plating technique, sputtering, and/or using any other material deposition technique, and at least partially fills the vias 132/134, as seen in FIG. 12, and to electrically couple the electrically conductive material with the electrical contacts 44 and/or with other elements, as may be seen in the figures.

A number of processing steps occur between the configuration shown in FIG. 12 and the configuration shown in FIG. 13. Layer 136 may be etched and/or portions of it may otherwise be selectively removed, such as shown in FIG. 13, so that it forms a redistribution layer (RDL) 138. An insulator layer 140 may be applied thereon, which may include a heating and pressing stage to ensure the insulator flows into and fills all of the desired locations. The insulator layer 140 is formed of an electrically insulative material, and may include a liquid polymer that later solidifies. One or more vias 142 may be formed, using any of the methods described above, which may pass through the insulator layer 140 and into one or more portions of the RDL (and/or the vias may expose the RDL without passing into the RDL).

A number of vias 144 are formed as well. Each via 144 passes through the second insulator layer 127 and first insulator layer 125 and into a portion of the copper layer 123 (and/or each via may expose a portion of the copper layer 123 without passing into the copper layer). The leftmost via 144 is also seen to expose or pass into a portion of the RDL 138, though in implementations this may not be necessary as the RDL and copper layer 123 are already electrically coupled.

Conductive plating layer (layer) 146 is plated or otherwise deposited on the insulator layer 140 and at least partially fills the one or more vias 142, and then is etched and/or portions of it are selectively removed to achieve the configuration shown in FIG. 13, so that portions of layer 146 are electrically coupled with portions of RDL 138. Other portions of layer 146 may be coupled with other elements of the PCB not shown in FIG. 13, and layer 146 may be coated with a layer of nickel, gold, or a combination thereof—and this may form under bump metallization (UBM) in some cases to receive the solder bumps shown in FIGS. 4-6.

Conductive plating layer (layer) 148 is plated or otherwise deposited on the second insulator layer 127 and at least partially fills the one or more vias 144, and then is etched and/or portions of it are selectively removed to achieve the configuration shown in FIG. 13, so that portions of layer 148 are electrically coupled with portions of the copper layer 123. Solder resist layers (layers) 150 may be deposited on the upper and lower surfaces and may be etched and/or portions of it may be selective removed to achieve the configurations shown in FIG. 13 to form the PCB 120. The solder resist ensures that when solder is used to electrically couple elements with the layers 146 and/or 148 (and/or when solder bumps are placed thereon) the different solder portions and/or solder balls will not contact one another.

Many other configurations are of course possible for a PCB with embedded ISP, and many other processing steps could be used (and/or some of the steps described above could be excluded). PCB 120 could be used in any of the packages shown in FIGS. 4-6. In the stages shown in FIGS. 11-13 under bump metal (UBM) may be formed below or above any of the vias to form electrical couplings. One or more of the electrically insulative layers shown in FIGS. 11-13 and described above may be formed of a pre-impregnated composite material (pre-preg) and/or an insulating film sold under the trade name AJINOMOTO BUILD-UP FILM (ABF) by Ajinomoto Fine-Techno Co., Inc. of Kawasaki, Japan. ABF may be used for one or more planner layers used during fabrication.

Forming packages, such as packages similar to those representatively illustrated in FIGS. 4-6 and described above, results in CIS packages that have embedded ISPs but which do not have increased package thickness (Z height) and for which the outer bump or electrical contact layout (pinout) is not constrained (as opposed to the examples shown in FIGS. 2-3). Signal integrity may also be enhanced as compared with configurations in which the ISP is not included in the CIS package because long traces are not needed to couple the ISP and CIS die. The methods and configurations shown in FIGS. 11-13 are used to redistribute and fan out the pin out of the ISP to achieve greater space between the pins/electrical connectors.

Figure 7:
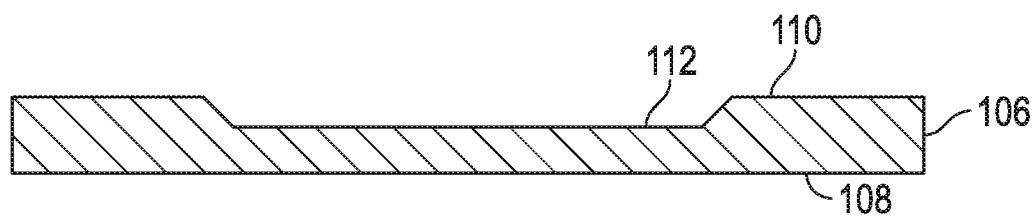
FIG. 7 is a cross-section view of an interposer used in the formation of the CIS package of FIG. 10.
Figure 8:
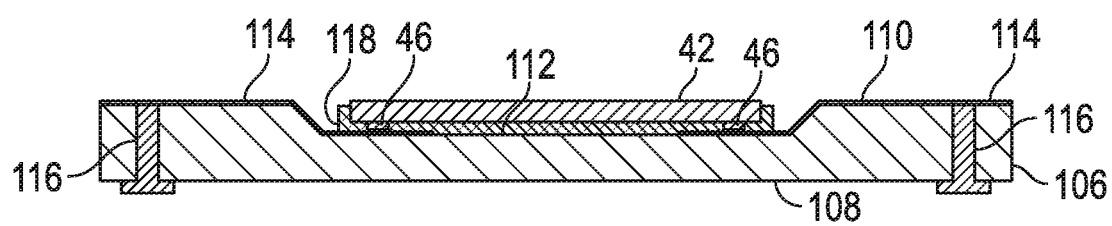
FIG. 8 is a cross-section view of the interposer of FIG. 7 plus additional elements used in the formation of the CIS package of FIG. 10.
Figure 9:
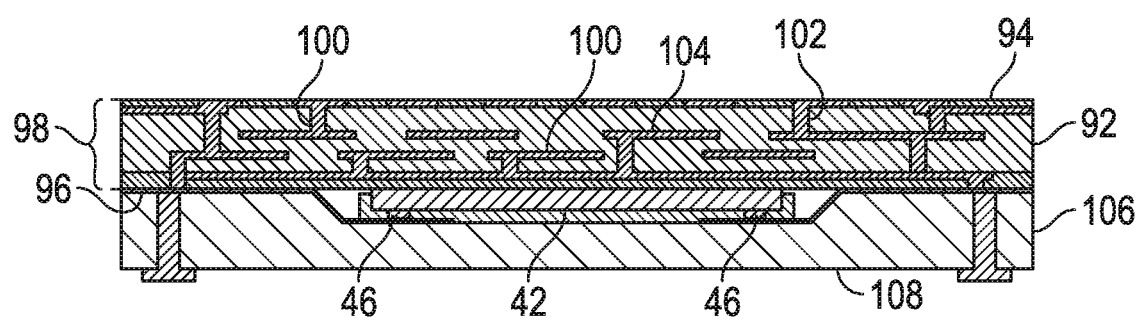
FIG. 9 is a cross-section view of the elements of FIG. 8 plus additional elements used in the formation of the CIS package of FIG. 10.
Figure 10:
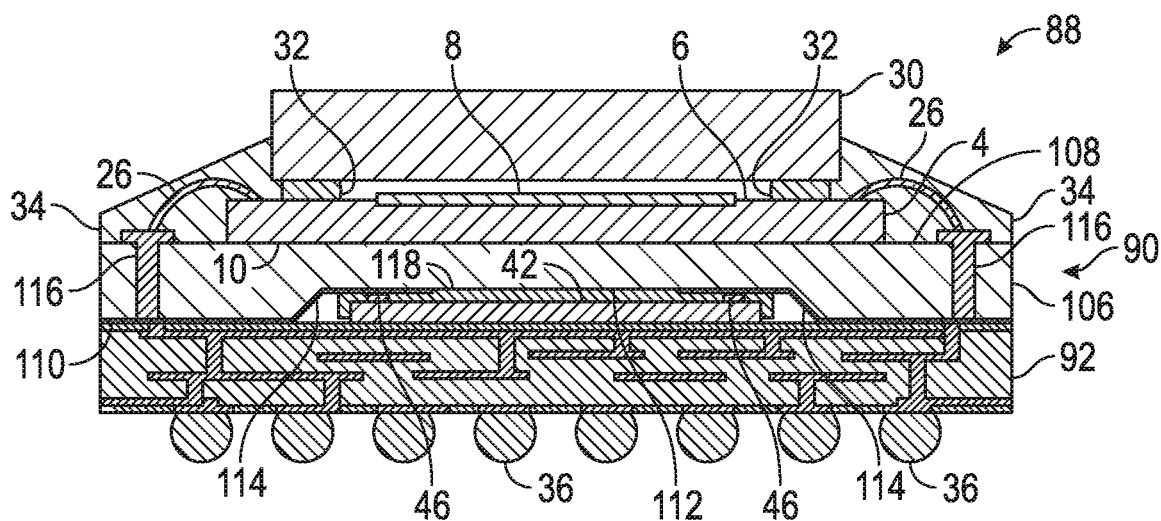
FIG. 10 is a cross-section view of an implementation of a CIS package with an embedded ISP.

FIGS. 7-10 show representative steps used in the formation of a CIS package (package) 88 which includes an ISP embedded within the package but not within a PCB. The completed package 88 is shown in FIG. 10. FIG. 7 shows an interposer 106 having a first surface 108 and a second surface 110 on an opposite side of the interposer from its first surface. The second surface includes a recess 112 therein. The interposer is formed of an electrically insulative material. In the representative example it is formed of silicon, though in other implementations it could be formed of another insulative material. The recess may be formed using a wet-etching wafer level process.

FIG. 8 shows that a number of through-holes or vias have been formed in the interposer from the first surface to the second surface, such as through a drilling (including laser drilling), etching, or other material removal process, and a metal or other electrically conductive material has been placed or deposited therein to form electrical vias 116. Any material deposition techniques and/or material removal techniques disclosed herein may be utilized to achieve the configuration of the electrical vias 116 shown in FIG. 8. Traces 114, which are formed of a metal or other electrically conductive material, are deposited on the second surface 110 and portions thereof are electrically coupled with the electrical vias.

The traces and/or electrical vias form a redistribution layer (RDL) for the ISP pinout. In various implementations, the through-holes, electrical vias and/or traces are formed through wafer level processing. The through-holes in other implementations are formed through reactive ion etching (RIE) and the electrical vias and/or traces in implementations are formed using plating (electro-plating or electro-less plating) and/or sputtering, though other material deposition techniques may be used. The ability to use wafer level processes for some of the fabrication steps may allow for efficient processing.

The ISP is flipped and bumped using solder 46 so that each of its electrical contacts is mechanically and electrically coupled with one of the traces. In alternative configurations a chip-on-board (COB) configuration could be used with bondwires and the ISP could be mechanically attached within the recess such as using an adhesive or a tape. The electrical contacts 44 or pads of the ISP may be formed of aluminum as previously described and may be bumped using gold plating, copper plating, a copper pillar bump with a solder cap thereon, a gold stud bump formed by a wirebonding machine, and the like, by non-limiting example.

The flip chip process/configuration shown in FIG. 8 will result in a gap between the ISP and the interposer and this may be filled using a fill material 118. The fill material may be an underfill (such as a molding compound) or a dry film.

A printed circuit board (PCB) 92 is coupled with the interposer. The PCB may be built using one or more of the sequential build-up (SBU) processes described earlier (though without embedding an ISP therein), and includes a first surface 94 and a second surface 96 opposite the first surface. The PCB includes a number of layers 98 which include interconnects 100 including vertical vias 102 and horizontal traces 104. The interposer and PCB may be attached to one another such as by using one or more adhesives, glues, solders, and so forth.

FIG. 10 shows that the structure shown in FIG. 9 may be flipped and a second surface 10 of the CIS die 4 may be coupled with the first surface 108 of the interposer. The CIS die has a photosensitive region 8, previously described, on its first surface 6, and also has one or more electrical contacts on its first surface. The CIS die may be coupled with the interposer such as using one or more adhesives, glues, solders, and so forth. The electrical contacts on the first surface of the CIS die are coupled with the electrical vias 116 using electrical couplers 26 (which in the implementation shown are wirebonds, though clips and the like could be used—as they could be with other CIS package implementations described herein). In other implementations the electrical contacts of the CIS die could be located on its second surface and could be routed to the electrical vias 116 using metallic or other conductive tracing on the first surface of the interposer, thus making the wirebonds unnecessary.

A transparent cover 30 is coupled over the CIS die using couplers 32 and encapsulant 34 is used to partially encapsulate the CIS die and to encapsulate the wirebonds and other elements. Electrical contacts 36, which in the implementation shown are solder bumps, are placed at the second surface of the PCB. The ISP and CIS die may thus communicate and/or are electrically coupled with one another through the wirebonds, electrical vias, and/or interconnects of the PCB, and the PCB and/or CIS die are electrically coupled with the electrical contacts 36 to communicate data with one or more elements external to the package as well.

The elements combined as in FIG. 10 form the completed CIS package 88, which is a ball grid array (BGA) package 90.

The PCB of package 88 thus includes or forms one or more RDLs to fan out the electrical contacts of the ISP. Additionally, the pad pitch at the second surface of the PCB may be greater or wider than the pad pitch of the electrical contacts of the ISP, which may be useful in some implementations in which a pad pitch greater than 100 microns is desired. The ISP pads may have a pad pitch smaller than 100 microns while the PCB second surface may have a pad pitch greater than 100 microns. The PCB may also form one or more RDLs to fan out or fan in the electrical contacts of the CIS die.

In implementations the side of the ISP opposite the side having electrical contacts 44 may have one or more additional electrical contacts coupled with traces or interconnects of the PCB to make further electrical connections between the ISP and one or more electrical contacts 36 and/or the CIS die.

In implementations the PCB shown in FIG. 9 may be sequentially built atop the already formed structure shown in FIG. 8 using one or more build-up processes previously described (or other build-up processes) to form the FIG. 9 assembly. In other implementations the PCB may be formed separately and then attached with the structure shown in FIG. 8 such as using a glue, an adhesive, solder, or the like.

Use of the interposer in implementations may result in good heat dissipation which may reduce or prevent thermal noise of images captured by the CIS package. The ball grid array (BGA) of electrical contacts/bumps may further serve to dissipate heat on the bottom side of the package. In implementations the package 88, and other packages which include an interposer, may have better heat dissipation than those which do not include an interposer, since the heat dissipation of an epoxy substrate (i.e., the PCB) may not have as desirable heat dissipation. Such heat can cause thermal noise of images captured by the CIS package. The ability to include the ISP in the recess of the interposer without having to embed it in the PCB may in implementations reduce cost. Supply chains for the elements of CIS package 88 may be more matured, as well, compared with those of the elements (including ISP embedded PCBs) of other CIS packages, which may further reduce cost and increase ease of material acquisition and processing.

In implementations the package 88 may not have an overall height (Z height) greater than those examples shown in FIGS. 2-3, and at the same time the bump/electrical contact layout is not constrained. A silicon interposer could be thinned down to 150 microns with a 50 micron ISP embedded therein using a flip chip bonding process, as described above (the interposer and ISP shown in the images have exaggerated size for ease of illustration). The RDL on the second surface of the interposer may be used for fan out or fan in, and may have good capability for fine pitch trace and pad patterning with fine lithography processes. The RDL of the interposer may eliminate the need to form an RDL on the ISP which may require fine pad pitch below 100 microns.

In implementations the PCBs 56/92/120 and/or interposers described herein may be formed using materials with matching (or incremental) coefficients of thermal expansion (CTEs) to match the CTE of the PCB 56/92/120, as much as possible, with a main motherboard or PCB (or base band) on which the package is mounted. This may reduce thermal stresses during board level reliability tests. This may prevent board level reliability issues after the package is mounted on a main PCB, motherboard or the like using surface mount technology (SMT) processes, and may remove the need to implement any underfill at the second surface of the PCB 56/92/120 and/or may remove the need for low stress solder balls to address board level reliability issues.

In implementations which include an interposer the interposer may effectively act as the initial processing substrate, which may remove the need to have any PCB core material (in other words the PCB may be built directly on the interposer as described above) which may decrease thickness.

In places where the description above refers to particular implementations of image sensor semiconductor packages and related methods and implementing components, sub-components, methods and sub-methods, it should be readily apparent that a number of modifications may be made without departing from the spirit thereof and that these implementations, implementing components, sub-components, methods and sub-methods may be applied to other image sensor semiconductor packages and related methods.

What is claimed is:

1. An image sensor semiconductor package, comprising:
    a printed circuit board (PCB) comprising a first surface and a second surface opposite the first surface;
    an interposer comprising a first surface and a second surface opposite the first surface of the interposer, the interposer comprising a recess in its second surface extending only partially through the interposer;
    a complementary metal-oxide semiconductor (CMOS) image sensor (CIS) die comprising a first surface comprising a photosensitive region and a second surface opposite the first surface of the CIS die, the second surface of the CIS die coupled with the first surface of the interposer; and
    an image signal processor (ISP) coupled within the recess of the interposer.

2. The package of claim 1, wherein the interposer further comprises one or more electrical vias passing through the interposer from the first surface of the interposer to the second surface of the interposer.

3. The package of claim 1, further comprising one or more electrical couplers electrically coupling the CIS die with the PCB through one or more electrical vias of the interposer.

4. The package of claim 1, further comprising a plurality of electrical contacts comprised at the second surface of the PCB and electrically coupled with the CIS die and with the ISP.

5. The package of claim 4, wherein the plurality of electrical contacts comprised at the second surface of the PCB comprise solder bumps.

6. The package of claim 4, wherein the plurality of electrical contacts comprise one of aluminum, gold plating, copper plating, a copper pillar bump, and a gold stud.

7. The package of claim 1, further comprising one or more redistribution layers (RDLs) fanning out one or more electrical contacts of the ISP by electrically coupling the one or more electrical contacts of the ISP with one or more of a plurality of electrical contacts comprised at the second surface of the PCB.

8. The package of claim 1, wherein the ISP is mechanically coupled with the recess through one of an adhesive or a tape.

9. An image sensor semiconductor package, comprising:
    a printed circuit board (PCB) comprising a first surface and a second surface opposite the first surface;
    an interposer comprising a first surface and a second surface opposite the first surface of the interposer, the interposer comprising a recess in its second surface and comprising one or more electrical vias passing through the interposer from the first surface of the interposer to the second surface of the interposer, wherein the recess extends only partially through the interposer;

a complementary metal-oxide semiconductor (CMOS) image sensor (CIS) die comprising a first surface comprising a photosensitive region and a second surface opposite the first surface of the CIS die, the second surface of the CIS die coupled with the first surface of the interposer;

an image signal processor (ISP) coupled within the recess of the interposer; and one or more electrical couplers electrically coupling the CIS die with the PCB through the one or more electrical vias of the interposer.

10. The package of claim 9, further comprising a plurality of electrical contacts comprised at the second surface of the PCB and electrically coupled with the CIS die and with the ISP.

11. The package of claim 10, wherein the plurality of electrical contacts comprised at the second surface of the PCB comprise solder bumps.

12. The package of claim 10, wherein the plurality of electrical contacts comprise one of aluminum, gold plating, copper plating, a copper pillar bump, and a gold stud.

13. The package of claim 9, further comprising one or more redistribution layers (RDLs) fanning out one or more electrical contacts of the ISP by electrically coupling the one or more electrical contacts of the ISP with one or more of a plurality of electrical contacts comprised at the second surface of the PCB.

14. The package of claim 9, wherein the ISP is mechanically coupled with the recess through one of an adhesive or a tape.

15. The package of claim 9, wherein the package does not comprise an image signal processor at the second surface of the PCB.

16. A method of forming an image sensor semiconductor package, comprising:

providing an interposer comprising a first surface and a second surface opposite the first surface of the interposer, the second surface of the interposer comprising a recess therein extending only partially through the interposer;

forming one or more electrical vias through the interposer from the first surface of the interposer to the second surface of the interposer;

coupling an image signal processor (ISP) within the recess of the interposer and electrically coupling the ISP with the one or more electrical vias;

coupling the interposer with a first surface of a printed circuit board (PCB), the PCB also having a second surface opposite the first surface of the PCB;

coupling a complementary metal-oxide semiconductor (CMOS) image sensor (CIS) die with the interposer, the CIS die comprising a first surface comprising a photosensitive region and a second surface opposite the first surface of the CIS die, the second surface of the CIS die coupled with the first surface of the interposer;

electrically coupling the CIS die with one or more electrical contacts located at the second surface of the PCB through the one or more electrical vias of the interposer; and electrically coupling the ISP with the CIS die through the one or more electrical vias of the interposer.

17. The method of claim 16, wherein the recess in the interposer is formed through a wet-etching wafer level process.

18. The method of claim 16, wherein the one or more electrical vias are formed through one of drilling and etching.

19. The method of claim 16, further comprising at least partially encapsulating the CIS die in an encapsulant.

20. The method of claim 16, further comprising forming one or more redistribution layers (RDLs) electrically coupling one or more electrical contacts of the ISP with one or more of a plurality of electrical contacts comprised at the second surface of the PCB.

* * * * *